United States Patent
Pletcher et al.

(10) Patent No.: US 10,606,560 B1
(45) Date of Patent: Mar. 31, 2020

(54) MITIGATING DETERMINISTIC ASYMMETRY IN A RANDOM NUMBER GENERATOR

(71) Applicant: Verily Life Sciences LLC, South San Francisco, CA (US)

(72) Inventors: Nathan Pletcher, Mountain View, CA (US); Robert Wiser, San Francisco, CA (US); Alireza Dastgheib, Mountain View, CA (US)

(73) Assignee: VERILY LIFE SCIENCES LLC, South San Francisco, CA (US)

( * ) Notice: Subject to any disclaimer, the term of this patent is extended or adjusted under 35 U.S.C. 154(b) by 31 days.

(21) Appl. No.: 15/975,675

(22) Filed: May 9, 2018

Related U.S. Application Data

(60) Provisional application No. 62/504,080, filed on May 10, 2017.

(51) Int. Cl.
 *G06F 7/58* (2006.01)
 *H03K 3/84* (2006.01)
(52) U.S. Cl.
 CPC .............. *G06F 7/588* (2013.01); *H03K 3/84* (2013.01)
(58) Field of Classification Search
 None
 See application file for complete search history.

(56) References Cited

U.S. PATENT DOCUMENTS

| | | | | |
|---|---|---|---|---|
| 4,810,975 A | * | 3/1989 | Dias ........................ | G06F 7/588 331/111 |
| 4,855,690 A | * | 8/1989 | Dias ........................ | G06F 7/588 331/78 |
| 6,362,677 B1 | * | 3/2002 | Petrofsky ............... | G01R 19/22 327/164 |
| 9,335,972 B2 | | 5/2016 | Yang et al. | |
| 9,780,798 B1 | * | 10/2017 | Das ....................... | H03M 1/001 |

(Continued)

OTHER PUBLICATIONS

Holleman et al., "A 3$\mu$ W CMOS True Random No. Generator With Adaptive Floating-Gate Offset Cancellation", IEEE Journal of Solid-State Circuits 43.5 (2008): 1324-1336.

(Continued)

*Primary Examiner* — David H Malzahn
(74) *Attorney, Agent, or Firm* — Kilpatrick Townsend & Stockton LLP

(57) ABSTRACT

Deterministic asymmetry in a random number generator can be mitigated by a circuit that includes a first inverter, a second inverter, a first capacitor, a second capacitor, a first switch, and a second switch. The first inverter can include a first input terminal and a first output terminal. The first inverter can have a first inverter threshold voltage. The second inverter can include a second input terminal and a second output terminal. The second inverter can have a second inverter threshold voltage. The first capacitor can be conductively coupled between the first output terminal and the second output terminal. The second capacitor can be conductively coupled between the second output terminal and the first input terminal. The first switch can be conductively coupled between the first input terminal and the first output terminal. The second switch can be conductively coupled between the second input terminal and the second output terminal.

20 Claims, 6 Drawing Sheets

(56) References Cited

U.S. PATENT DOCUMENTS

| | | | | |
|---|---|---|---|---|
| 2006/0098500 A1* | 5/2006 | Chen | ............ | G06F 7/588 365/189.09 |
| 2008/0091755 A1 | 4/2008 | Mudge et al. | | |
| 2010/0332574 A1* | 12/2010 | Herbert | ............ | G06F 7/588 708/251 |
| 2011/0131263 A1* | 6/2011 | Vasyltsov | ............ | G06F 7/588 708/251 |
| 2016/0062735 A1* | 3/2016 | Wilber | ............ | G06F 7/588 706/46 |
| 2018/0143806 A1* | 5/2018 | Park | ............ | G06F 7/582 |

OTHER PUBLICATIONS

Mathew et al., "2.4 Gbps, 7 mW all-digital PVT-variation tolerant true random number generator for 45 nm CMOS high-performance microprocessors", IEEE Journal of Solid-State Circuits 47.11 (2012): 2807-2821 (abstract only).

Tokunaga et al., "True random number generator with a metastability-based quality control", IEEE Journal of Solid-State Circuits 43.1 (2008): 78-85.

* cited by examiner

US 10,606,560 B1

MITIGATING DETERMINISTIC ASYMMETRY IN A RANDOM NUMBER GENERATOR

CROSS-REFERENCE TO RELATED APPLICATIONS

The present application claims priority to Provisional Application No. 62/504,080, filed on May 10, 2017, and entitled "Mitigating Deterministic Asymmetry In A Random Number Generator," the entirety of which is hereby incorporated by reference herein.

TECHNICAL FIELD

The present disclosure relates generally to random number generators. More specifically, but not by way of limitation, this disclosure relates to mitigating deterministic asymmetry in a random number generator.

BACKGROUND

Random number generators are used in various fields including network security, cryptography, computer simulations, statistical sampling, and other fields where producing an unpredictable result is desirable. The randomness of an output of a random number generator can be determined using statistical tests that measure the unpredictability of the output. Some random number generators are referred to as pseudo-random number generators and produce pseudo-random outputs that are predictable for a given input. For example, a computer program that uses a mathematical formula to produce a seemingly random output is a pseudo-random number generator if the seemingly random output is always the same (and therefore predictable) for a given input. Other random number generators are referred to as true-random number generators, which may generate a truly random output, such as based on a physical phenomenon that is believed to be random. Examples of physical phenomenon include atmospheric noise, thermal noise, and other external electromagnetic and quantum phenomena. However, even when relying on such physical phenomena, the randomness of the output of a true-random number generator can be affected by errors or biases, such as when measuring the physical phenomenon. Errors that cause the output to be predictable can be referred to as deterministic errors. In some case, these deterministic errors can be mitigated by calibrating the true-random number generator based on a statistical analysis of outputs of the true-random number generator. In some examples, calibrating a true-random number generator takes time, only last for a period of time, and introduces pseudo-randomness by applying a mathematical formula.

SUMMARY

Various examples are described for mitigating deterministic asymmetry in a random number generator. For example, one disclosed example circuit includes a first inverter comprising a first input terminal and a first output terminal, the first inverter having a first inverter threshold voltage; a second inverter comprising a second input terminal and a second output terminal, the second inverter having a second inverter threshold voltage; a first capacitor conductively coupled between the first output terminal and the second input terminal; a second capacitor conductively coupled between the second output terminal and the first input terminal; a first switch conductively coupled between the first input terminal and the first output terminal; and a second switch conductively coupled between the second input terminal and the second output terminal.

One disclosed example method includes substantially simultaneously closing a first switch and a second switch, the first switch conductively coupled between a first input terminal of a first inverter and a first output terminal of the first inverter, the second switch conductively coupled between a second input terminal of a second inverter and a second output terminal of the second inverter, a first output terminal of the first inverter being conductively coupled to the second input terminal of the second inverter by a first capacitor, and the second output terminal of the second inverter being conductively coupled to the first input terminal of the first inverter by a second capacitor; storing a first voltage on the first capacitor, the first voltage substantially equal to a difference between a first inverter threshold voltage of the first inverter and a second inverter threshold voltage of the second inverter; storing a second voltage on the second capacitor, the second voltage substantially equal to a difference between the second inverter threshold voltage of the second inverter and the first inverter threshold voltage of the first inverter; substantially simultaneously opening the first switch and the second switch; and delaying a measurement of an output of the first inverter and an output of the second inverter until the first inverter settles to a first output voltage and the second inverter settles to a second output voltage.

One disclosed example system includes a means for generating two randomly-selected output voltages, which includes a first inverter comprising a first input terminal and a first output terminal, the first inverter having a first inverter threshold voltage; a second inverter comprising a second input terminal and a second output terminal, the second inverter having a second inverter threshold voltage; a first capacitor conductively coupled between the first output terminal and the second input terminal; a second capacitor conductively coupled between the second output terminal and the first input terminal; a first switch conductively coupled between the first input terminal and the first output terminal; and a second switch conductively coupled between the second input terminal and the second output terminal; and a means for outputting a digital bit based on the randomly-selected output voltages, which includes a first output voltage terminal conductively coupled to the first output terminal; and a second output voltage terminal conductively coupled to the second output terminal.

One disclosed example method for assembling a random number generator that mitigates deterministic asymmetry includes providing a first inverter comprising a first input terminal and a first output terminal, the first inverter having a first inverter threshold voltage providing a second inverter comprising a second input terminal and a second output terminal, the second inverter having a second inverter threshold voltage; conductively coupling the first output terminal and the second input terminal with a first capacitor; conductively coupling the second output terminal and the first input terminal with a second capacitor; conductively coupling the first input terminal and the first output terminal with a first switch; and conductively coupling the second input terminal and the second output terminal with a second switch.

These illustrative examples are mentioned not to limit or define the scope of this disclosure, but rather to provide examples to aid understanding thereof. Illustrative examples are discussed in the Detailed Description, which provides further description. Advantages offered by various examples may be further understood by examining this specification.

BRIEF DESCRIPTION OF THE DRAWINGS

The accompanying drawings, which are incorporated into and constitute a part of this specification, illustrate one or more certain examples and, together with the description of the example, serve to explain the principles and implementations of the certain examples.

DETAILED DESCRIPTION

Certain aspects and features relate to mitigating deterministic asymmetry in a random number generator. In some aspects, a random number generator includes a circuit with cross-coupled inverters such that the output of each inverter is conductively coupled to the input of the other inverter by a capacitor. In addition, the input of each inverter is coupled to its output by a switch. When the switches are both closed, the voltage across the input and output settles to the threshold voltage for the respective inverter. Because inverters tend to have slightly different threshold voltages due to manufacturing variances, the capacitors maintain a voltage differential based on the difference in the respective threshold voltages of the two inverters. When the switches are later opened, the inverters will, after a period of time, settle to a steady, stable state, outputting either a high or low voltage corresponding to a digital 1 or 0, respectively. Because the inverters are cross-coupled, one inverter will settle to an output state of 1, while the other will settle to an output state of 0. Because inherent differences in threshold voltages between different inverters are buffered by the capacitors, which inverter settles at 1 or 0 is much more likely to be nondeterministic than if the two inverters were simply cross-coupled. Thus, the circuit outputs a pair of values that can be used to generate a random number, e.g., a random bit, such as by applying the two output values to a comparator and reading the output value of the comparator. Thus, a relatively simple circuit arrangement can be used to more reliably generate nondeterministic random values.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative aspects but, like the illustrative aspects, should not be used to limit the present disclosure.

Figure 1:
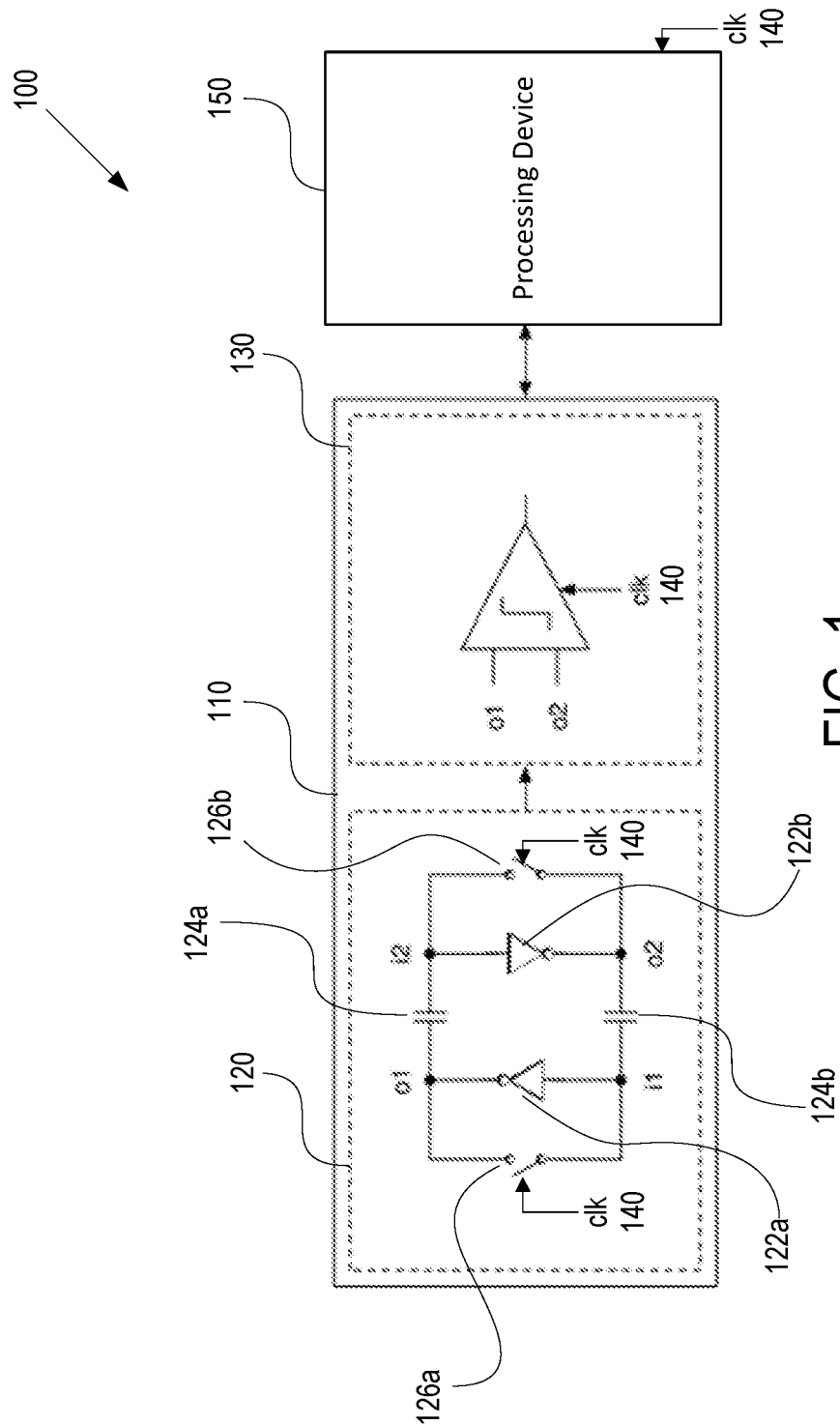
FIG. 1 is a schematic diagram of an example a random number generator with cross-coupled inverters for mitigating deterministic asymmetry in the random number generator according to one example of the present disclosure.

FIG. 1 is a schematic diagram of an example random number generator 100 that includes a random bit generator 110 communicatively coupled to a processing device 150. The random bit generator 110 includes a metastable circuit 120 coupled to a comparator device 130. The metastable circuit 120 includes inverters 122a-b, capacitors 124a-b, and switches 126a-b. Each of the inverters 122a-b includes an input terminal and an output terminal. The inverters 122a-b are cross-coupled in series by the capacitors 124a-b such that the output terminal of inverter 122a is conductively coupled to the input terminal of inverter 122b via the capacitor 124a, and the output terminal of inverter 122b is conductively coupled to the input terminal of inverter 122a via the capacitor 124b. The switch 126a is coupled between the input terminal and the output terminal of inverter 122a and switch 126b is coupled between the input terminal and the output terminal of inverter 122b.

The inverters 122a-b in this example are digital logic gates that receive a voltage representing a binary value. If the voltage is sufficiently high, or low, with respect to the inverter's threshold voltage, the inverter will output the opposite binary value of the input. For example, the inverters 122a-b output a high voltage (e.g., a voltage above a threshold voltage) in response to receiving a low voltage (e.g., a voltage below a threshold voltage) or a low voltage in response to receiving a high voltage. The threshold voltage of each inverter 122a-b is set during manufacturing, but the threshold voltages for different inverters can differ slightly due to manufacturing variances. For example, inverter 122a can have a threshold voltage of 0.55 V and inverter 122b can have an inverter threshold voltage of 0.45 V. An input voltage of 0.5 V would be below the inverter threshold voltage of inverter 122a, which would output a high voltage (e.g., 0.55 V) and the input voltage of 0.5 V would be above the inverter threshold voltage of inverter 122b, which would output a low voltage (e.g., 0.45 V).

The comparator device 130 includes two input terminal, one of the input terminals of the comparator device 130 is conductively coupled to the output terminal of inverter 122a. The other one of the input terminals of the comparator 130 is conductively coupled to the output terminal of the inverter 122b. The comparator 130 also includes an output terminal that is coupled to the processing device 150.

In some aspects, the switches 126a-b are used to change the metastable circuit between two different states: a reset state and an output state. In the reset state, the switches 126a-b are closed, which causes the input and output terminals of inverter 122a-b, respectively, to be shorted together. The capacitors 124a-b, which were initially discharged, will behave as a short and current in the metastable circuit 120 will flow through the capacitors 124a-b causing a voltage substantially equal to a difference in the threshold voltage of the inverters 122a-b to be stored on the capacitors 124a-b. Once the capacitors 124a-b are charged, the capacitors behave as an open circuit and divide the metastable circuit 120 into two loops. Each loop includes one of the inverters 122a-b and one of the switches 126a-b.

At a later time, when the switches 126a-b are opened, the capacitors 124a-b will discharge to apply the voltage substantially equal to the difference between the threshold voltages of each inverter 122a-b to the input terminal of each inverter 122*a-b*. As the capacitors 124*a-b* discharge, the capacitors 124*a-b* will begin to behave as a short between the output terminal of each inverter 124*a-b* with the input terminal of the other inverter 124*a-b*. Random noise will then become a factor in causing one of the inverter's inputs to trigger the inverter to settle to either a high or a low state. This will then cause the other inverter to settle to the other of the two states. Thus, the voltages applied by the capacitors 124*a-b* help to mitigate deterministic asymmetry in the inverters and thereby help the metastable circuit 120 generate non-deterministic outputs.

In some aspects, the outputs from the two inverters may be used directly by a device as inputs, or the outputs of the metastable circuit 120 may be coupled to another device to generate a discrete random bit. In this example, the outputs of the metastable circuit 120 are coupled to a comparator device 130. The comparator device 130 accepts the inputs and generates an output based on a difference between them. Thus, depending on which of the two inverters 122*a-b* outputs a high vs. low value, the comparator will output a high or a low voltage, signifying a digital 1 or 0. In examples employing such digital 1s and 0s, these discrete comparator voltages may be referred to as "digital bits."

In some examples, the comparator device 130 includes a comparator or an operational-amplifier. These, or other suitable devices, compare the output voltages of the metastable circuit 120 and output a voltage based on which of the two output voltages is higher. In additional or alternative examples, the comparator device 130 includes any means for outputting a digital bit based on the output voltages of the inverters that indicates which of the two output voltages is higher or lower than the other.

In some aspects, the processing device 150 receives the output from the comparator 130 or the metastable circuit 120 and verifies the randomness of the received output based on a statistical analysis of previously-received outputs. If the processing device 150 determines that the received outputs are likely random, it then may provide the output to another device or to other circuitry within the processing device 150 or program code executed by the processing device 150. In additional or alternative aspects, the processing device 150 uses the received outputs to form a multibit random number in conjunction with previously-received outputs. For example, to generate a random 8-bit value, the processing device 150 may receive eight randomly-selected bits and consecutively order them to create an 8-bit value. The next eight randomly-selected bits may form a subsequent 8-bit value, and so forth. In some examples, if the processing device 150 determines the outputs are likely biased, it discards them. Although FIG. 1 depicts an example of a processing device, any means for verifying the randomness of the digital bit may be used or any means for determining a multibit number based on multiple digital bits may be used.

The switches 126*a-b* include any means for breaking (e.g., opening) an electrical circuit to interrupt or divert current flow and making (e.g., shorting) an electrical circuit to allow current flow. In some examples, the switches 126*a-b* include an electromechanical relay such as an electromagnet. In additional or alternative examples, the switches include a solid-state relay such as a semiconductor device (e.g., a silicon-controlled rectifier or a triac). In some aspects, the switches 126*a-b* include transistors or other similar switching components formed as a part of an integrated circuit.

In this example, the switches 126*a-b*, the comparator device 130, and the processing device 150 are coupled to a clock source that provides a clock signal 140 that oscillates between two states, a high state and a low state. The different components shown in FIG. 1 may change state or may perform functions based on the oscillations of the clock signal. For example, one or more of the components may be "edge" triggered or "state" triggered. An edge-triggered component changes states or performs a function when the clock transitions from one state to another, e.g., at the transition from a low state to a high state, or the transition from a high state to a low state. A state-triggered component, by contrast, changes states or performs a function while the clock remains at one of the two states. The edges and states of a clock signal may be referred to as "portions" of the clock signal.

As discussed above, the switches 126*a-b* may open and close to allow the inverters 122*a-b* to randomly generate outputs. In this example, the switches 126*a-b* receive the clock signal 140 and switch based on portions of the received clock signal 140. For example, if the switches 126*a-b* are edge-triggered, the switches 126*a-b* may open on a rising edge of the clock signal 140 and close on a falling edge of the clock signal 140, or vice versa. If they are state (or level) triggered, the switches 126*a-b* may open when the clock signal 140 is in a high state and close when the clock signal 140 is in a low state. Thus, the clock may enable the metastable circuit 120 to periodically output randomly-selected voltages from the inverters to the comparator 130 and then reset.

Likewise, the comparator 130 may be driven by a clock to generate and latch a new output, e.g., once per clock cycle to provide a randomly-generated bit to the processing device 150. Further, the processing device 150 may be operated based on the clock signal 140 to periodically receive and verify the latched output of the comparator 130. Thus, the random bit generator 100 may periodically generate a random bit value.

While the example discussed above included certain components, one or more components may be added, subtracted, or combined from the configuration of the random bit generator 100 shown in FIG. 1 without departing from the scope of the present disclosure. In additional or alternative examples, the processing device 150 is excluded.

Figure 2:
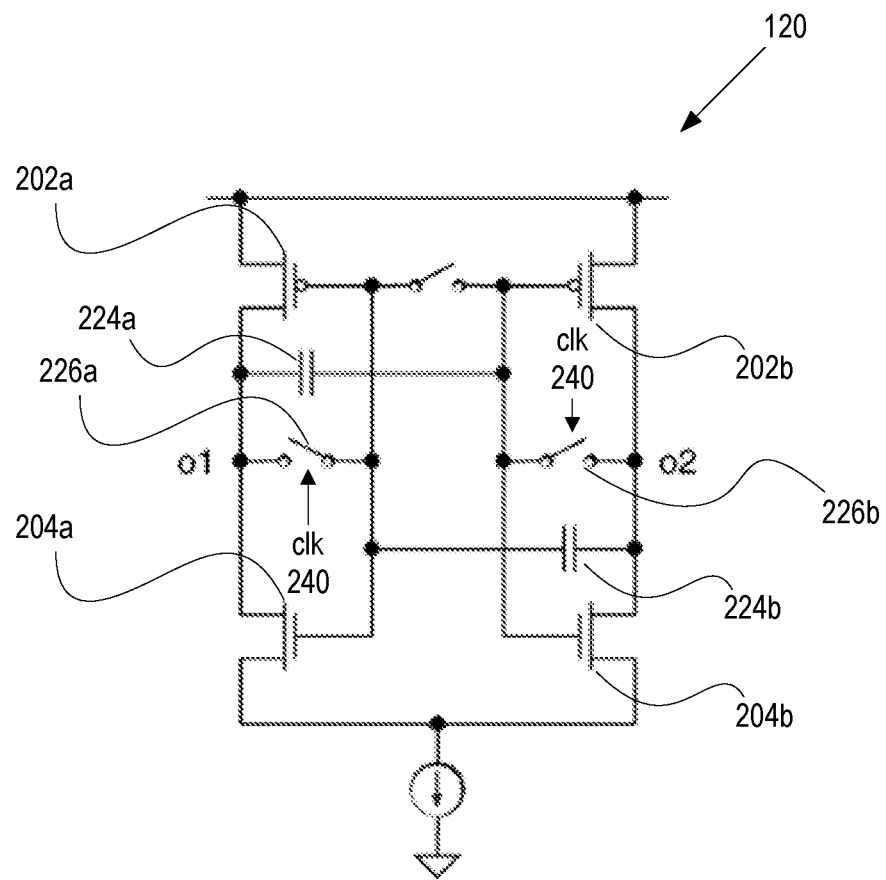
FIG. 2 is a transistor-level schematic diagram of an example of a metastable circuit with cross-coupled inverters for mitigating deterministic asymmetry in the random number generator according to one example of the present disclosure.

FIG. 2 is a transistor-level schematic diagram of an example of the metastable circuit 120 in FIG. 1. The inverters 122*a-b* in FIG. 1 are depicted as complementary metal-oxide-semiconductor ("CMOS") transistors, which each include a p-type metal-oxide-semiconductor ("PMOS") transistor 202*a-b* and an n-type metal-oxide-semiconductor ("NMOS") transistor 204*a-b*. Capacitors 224*a-b* conductively couple the output of each CMOS transistor to the input (the gate voltage) of the other CMOS transistor. Although FIG. 2 depicts the inverters 122*a-b* as CMOS transistors, other inverter configurations are encompassed by this disclosure. For example, the inverters 122*a-b* may include single transistor configurations.

Switches 226*a-b* are coupled between the input and the output of the CMOS transistors. The switches 226*a-b* are communicatively coupled to a clock source to receive a clock signal 240, which controls the opening and closing of the switches 226*a-b* in this example. As in FIG. 1, the CMOS transistors enter a metastable state while the switches 226*a-b* are closed and the capacitors 224*a-b* store a voltage substantially equal to a difference in the threshold voltage between the CMOS transistors. The capacitors 224*a-b* discharge while the switches 226*a-b* are open and the output of the CMOS transistors settle to randomly-selected output voltages.

Figure 3:
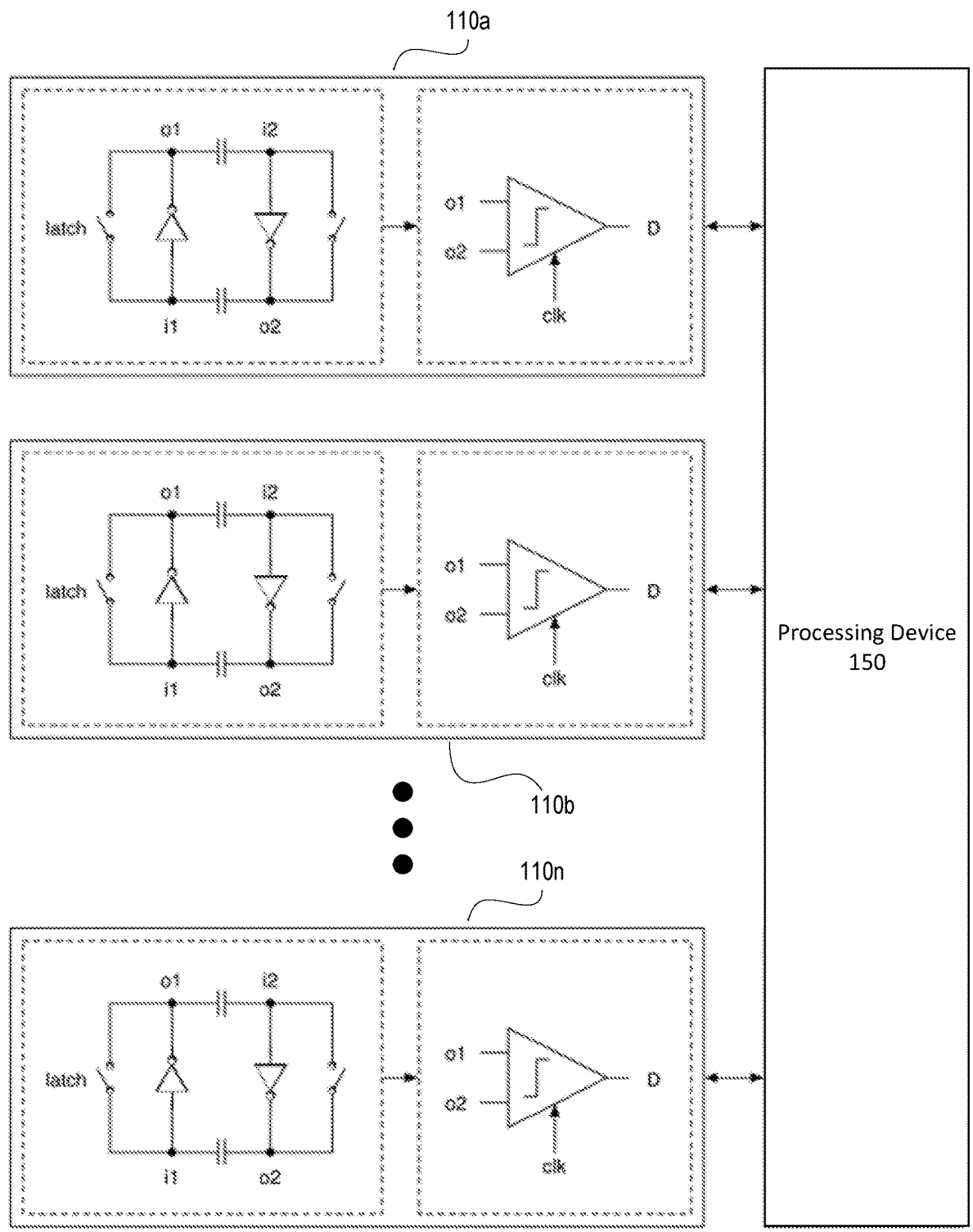
FIG. 3 is a schematic diagram of multiple random number generators coupled to a processing device for generating a random number according to one example of the present disclosure.

FIG. 3 is a schematic diagram of an example of multiple random bit generators 110a-n communicatively coupled in parallel to the processing device 150 depicted in FIG. 1. Each of the random bit generators 110a-n are an example of the random bit generator 110 depicted in FIG. 1 and generate a randomly-generated digital bit during each clock cycle. In some aspects, the processing device 150 determines a random multibit number by combining the digital bit from each of the random number generators 110a-n. For example, a multibit number may be generated by assigning the output of random bit generator 110a as a least-significant bit of the multibit number, the output of random bit generator 110b as the most-significant bit of the multibit number, and the intervening outputs consecutively as the intervening bits. Still other approaches may be employed.

Figure 4:
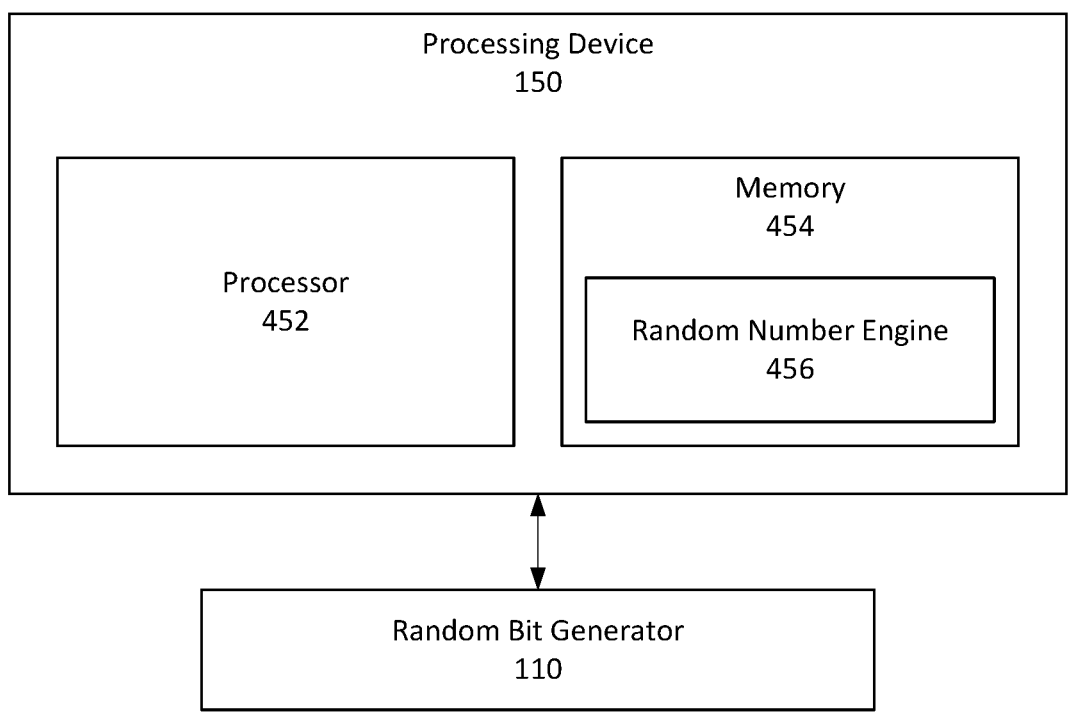
FIG. 4 is a block diagram of a processing device for verifying a randomness of a random number generated by a random number generator according to one example of the present disclosure.

In some examples, the processing device 150 produces a random multibit number every clock cycle. In additional or alternative examples, the processing device 150 stores the digital bits from multiple clock cycles and uses the digital bits from multiple clock cycles to determine a random multibit number. For example, the processing device 150 determines a random multibit number from the digital bits by assigning each digital bit a different position in the multibit number. Coupling multiple random bit generators 110a-n to the processing device 150 reduces the time for producing a multibit random number. Although FIG. 3 depicts processing device 150, any means for determining a multibit number from multiple sources of digital bits can be implemented FIG. 4 is a block diagram of an example of the processing device 150 depicted in FIG. 1 communicatively coupled to the random bit generator 110 from FIG. 1. The processing device 150 can include any number of processors 152 configured for executing program code stored in memory 154. Examples of the processing device 150 include a microprocessor, an application-specific integrated circuit ("ASIC"), a field-programmable gate array ("FPGA"), or another suitable processor. In some examples, the processing device 150 is a dedicated processing device used for verifying a randomness of a digital bit. In additional or alternative examples, the processing device 150 also determines a multibit number based on more than one digital bit.

The processing device 150 can include (or be communicatively coupled with) a non-transitory computer readable medium 154. The memory 154 can include one or more memory devices that can store program instructions. The program instructions can include for example, a random number engine 156.

A random number engine 156 according to this disclosure may be executable by the processing device 150 to perform certain operations, such as verifying whether a received input represents a random value or was generated as a result of a deterministic process or determining a multibit number from one or more received inputs. In some examples, the processing device 150 compares the digital bit received from the random bit generator 110 with previous digital bits received from the random bit generator 110 that are stored in the memory 154. The processing device 150 analyzes the set of digital bits to determine if the digital bit produced is statistically random. In some examples, the processing device 150 discards a digital bit based on detecting bias in the random bit generator 110. In some examples, the processing device 150 performs one or more cryptographic hash functions, e.g., MD5 or SHA-1 techniques, to verify or improve the randomness of the received input. In additional or alternative examples, the processing device 150 performs the von Neumann extractor technique to remove bias or deterministic characteristics of the received input. In additional or alternative examples, the processing device 150 can shift and perform XOR logic on portions of the received input to improve the randomness of the received input.

In some examples, the processing device 150 may disable or ignore inputs from a random bit generator 110 that generates deterministic values at a rate greater than a threshold. For example, if the processing device 150 determines that, of 12 random bit generators, two are generating deterministic values more than 10% of the time, it may output a signal to disable those two random bit generators, or may stop accepting inputs from those two random bit generators. Such a technique may reduce power consumption and enable more efficient generation of random bit values.

To determine a random multibit number, the random number engine 156 may employ more than one received input. In some examples, the processing device 150 is communicatively coupled to multiple random bit generators 110. Each of the random bit generators 110a-n generate a digital bit each clock cycle and the processing device uses the multiple digital bits to determine a multibit random number. In other examples, processing device 150 may be in communication with only one random bit generator 110 and generate a multibit number from a succession of received bits.

In some examples, the processing device 150 may further be configured to perform a calibration process to improve a randomness of the random numbers. In some examples, the processing device 150 measures and records the time taken for the inverters to settle on an output. The processing device 150 can initiate a calibration process in response to the time being less than a threshold value. An additional voltage can be applied to the input of the inverters, which the processing device can calibrate to adjust the time taken by the inverters to settle. In some examples, the processing device 150 varies a value for the additional voltage and measures the time taken for the output to settle while each value for the additional voltage is applied. The processing device 150 selects the value for the additional voltage based on the measurements such that the time taken by the inverter to settle exceeds the threshold value. In additional or alternative examples, the capacitors 124a, 124b may be an array of tunable capacitors or part of such an array. The processing device 150 can calibrate the RNG generator 110 by adjusting the capacitance of the capacitors 124a, 124b to provide different capacitances at 124a, 124b, which may improve the randomness of the random numbers, such as by compensating for the inverters having different power outputs or for clock feedthrough.

Figure 5:
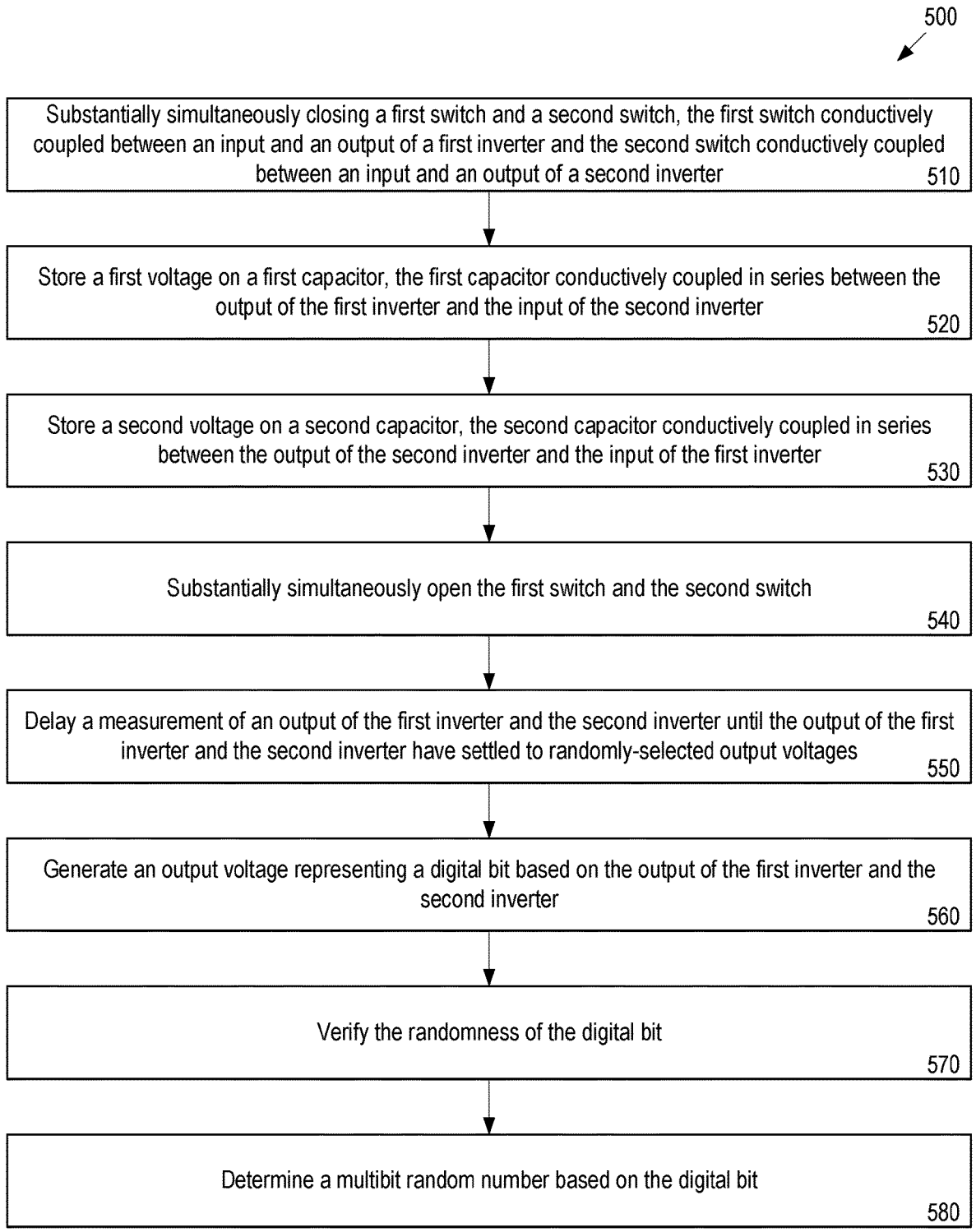
FIG. 5 is a flow chart of an example process for mitigating deterministic asymmetry in a random number generator according to one example of the present disclosure.

FIG. 5 is a flow diagram of an example of a process 500 for mitigating deterministic asymmetry in a random number generator. Mitigating deterministic asymmetry can improve randomness of an output of the random number generator. The process 500 mitigates deterministic asymmetry in substantially real-time, which is faster and uses less processing power than a calibration step. The description of FIG. 5 will be made with respect to the circuit shown in FIG. 1; however, it should be appreciated that any suitable circuit according to this disclosure may be employed.

In block 510, the first switch 126a and the second switch 126b are closed substantially simultaneously. In some aspects, the first switch 126a and the second switch 126b receive the clock signal 140 including a clock cycle having a first portion and a second portion. The first switch 126a and the second switch 126b can close substantially simultaneously in response to a first portion (e.g., a clock edge or a clock level) of the clock cycle. In additional or alternative aspects, a signal generator (e.g., a clock) generates a single switching signal and transmits the signal to the switches 126a-b at the same time. The first switch 126a and the second switch 126b can close substantially simultaneously by closing in response to receiving the switching signal. Closing the first switch 126a and the second switch 126b shorts the output of the inverters 122a-b to the input of the inverters 122a-b. In some aspects, closing the first switch 126a and the second switch 126b resets a stable output of the inverters 122a-b to a metastable state such that the output varies over time.

In block 520, a first voltage is stored on the first capacitor 124a. The first capacitor 124a being conductively coupled in series between the output of the first inverter 122a and the input of the second inverter 122b. As discussed above, the capacitors 124a-b, which were initially discharged, will behave as a short circuit and current in the metastable circuit 120 will flow through the capacitors 124a-b causing a voltage substantially equal to a difference in the threshold voltage of the inverters 122a-b to be stored on the capacitors 124a-b.

In block 530, a second voltage is stored on a second capacitor 124b. The second capacitor 124b is conductively coupled in series between the output of the second inverter 122b and the input of the first inverter 122a. In some aspects, closing the first switch 126a and the second switch 126b causes current to flow through the capacitors 124a-b until the capacitors 124a-b are charged.

In block 540, the first switch 126a and the second switch 126b are opened substantially simultaneously. For example, the first and second switches 126a-b may open in response to a second portion of the clock signal. Opening the switches breaks the short between the output and input of each inverter.

In block 550, the output of the first inverter 122a and the output of the second inverter 122b are allowed to randomly settle to output voltages. The first capacitor 124a and the second capacitor 124b apply the first voltage and the second voltage to the second inverter 122b and the first inverter 122a, respectively, to mitigate deterministic asymmetry in the metastable circuit 120 such as a difference in the threshold voltage of the first inverter 122a and the second inverter 122b. Current will travel in a single loop through both inverters 122a-b and capacitors 124a-b until the capacitors 124a-b discharge and the output of the inverters 122a-b settle based on random noise (e.g., atmospheric noise and thermal noise). The output of the first inverter 122a and the second inverter 122b will be randomly-selected output voltages.

At block 560, the comparator device 130 receives the outputs from the metastable circuit 110 and generates an output voltage representing a digital bit. In some aspects, the comparator device 130 is conductively coupled to the output terminals of the inverters 122a-b and the comparator device 130 outputs a digital bit based on the output voltages of the inverters 122a-b. Using output voltages from a metastable circuit 110 that mitigates deterministic asymmetry, the comparator device 130 can produce a digital bit with a high degree of randomness.

At block 570, the output of the comparator device 130 (e.g., a digital bit) is provided to a means for verifying the randomness of the digital bit (e.g., the processing device 150 in FIG. 4). The means for verifying the randomness of the digital bit can compare the digital bit to previous digital bits output by the comparator device 130 to verify that the digital bit is occurring within a threshold value of a statistically random frequency.

At block 580, a digital bit is transmitted to a means for determining a multibit random number. In some examples, the means for determining a multibit random number may receive one or more digital bits from the means for verifying, or may receive the digital bits from the output of the comparator device 130, or it may receive the output voltages from the metastable circuit 110. In some examples, the means for determining a multibit random number stores digital bits from the comparator device 130 each clock cycle and after a predetermined number of clock cycles combines the digital bits to form a multibit random number. In additional or alternative examples, the means for determining a multibit random number is conductively coupled to multiple comparator devices each conductively coupled to a metastable circuit. The means for determining a multibit random number receives multiple digital bits each clock cycle and generates a multibit random number by combining the multiple digital bits.

In some aspects, the process 500 is used with other techniques for improving a randomness of an output from the random number generator 100. Calibration techniques can be used to further improve the randomness of an output of the random number generator 100 with mitigated deterministic asymmetry. In some examples, an additional voltage is applied to the input of the inverters 122a-b during a portion of the clock cycle. The additional voltage is calibrated to a magnitude such that the time taken for the output of the inverters 122a-b to settle exceeds a threshold value. The processing device 150 can measure the time it takes the output of the inverters 122a-b to settle for a series of different magnitudes for the additional voltage and determine the magnitude based on the measurements. Based on the settling time, the processing device 150 can adjust a frequency of a clock signal to provide sufficient time for the inverters 122a-b to reset or settle to output voltages. For example, a period of a clock signal may be set to twice the settling time.

It should be appreciated that the blocks of the method of FIG. 5 need not be performed in the order described, or that some blocks involve optional features, such as blocks 560-580, or that other blocks may be employed in addition to, or instead of, those described above.

Figure 6:
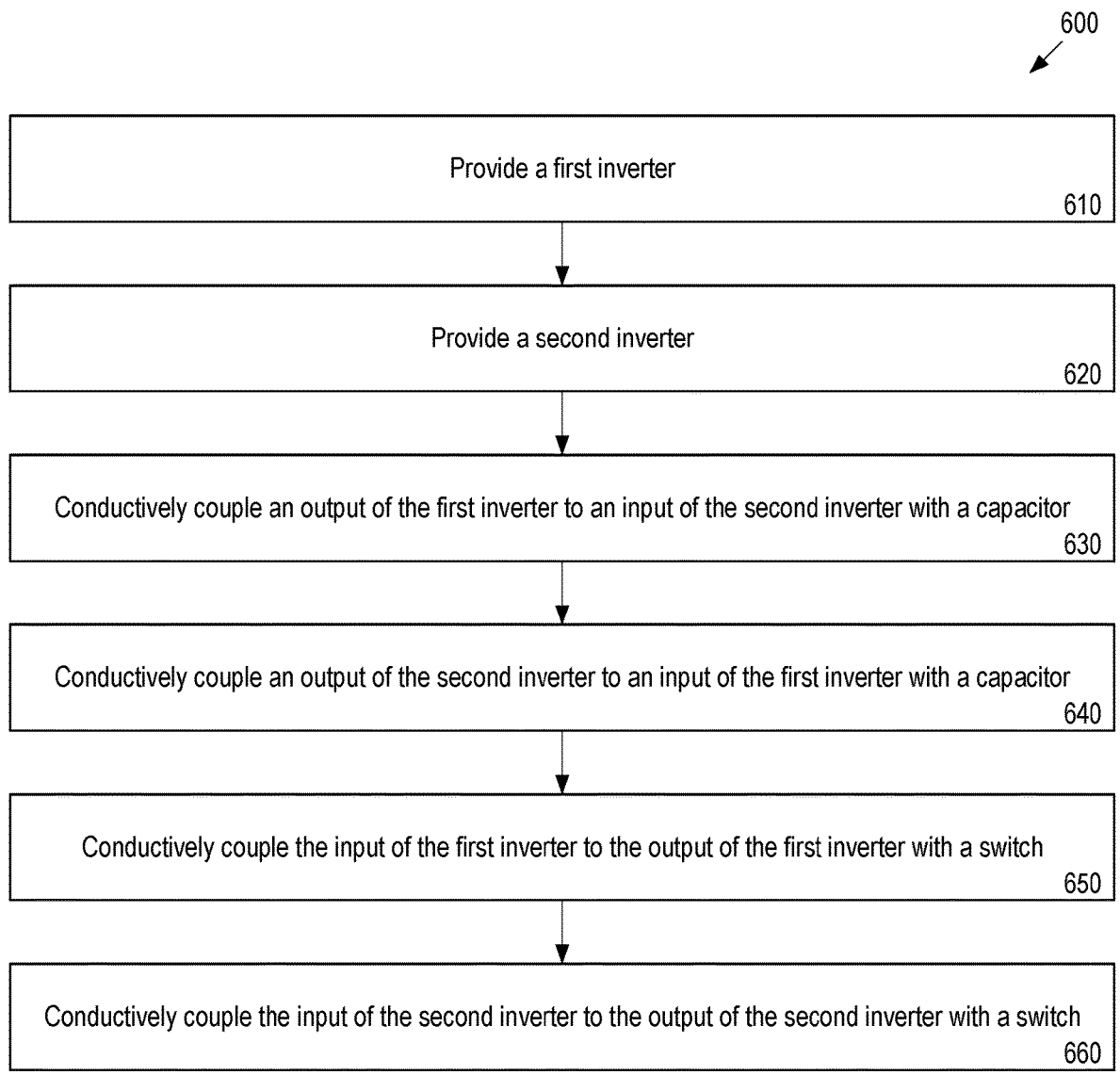
FIG. 6 is a flow chart of an example process for manufacturing a random number generator according to one example of the present disclosure.

FIG. 6 is a flow diagram of an example of a process 600 for manufacturing a random number generator that mitigates deterministic asymmetry present within the components of the random number generator. In some aspects, the random number generator manufactured by process 600 can provide random numbers with a higher degree of randomness and can that takes less area than random number generators that depend on a calibration step.

In block 610, a first inverter is provided. For example, the first inverter may be formed on a silicon wafer as a part of an ASIC or other integrated circuit. In some examples, the first inverter may be provided as a discrete circuit component, or may be provided in a package having multiple inverters. In block 620, a second inverter is provided. As with the first inverter, the second inverter may be formed on a silicon wafer as a part of an ASIC or other integrated circuit. In some examples, the first inverter may be provided as a discrete circuit component, or may be provided in a package having multiple inverters.

In some aspects, the first inverter and the second inverter include a transistor-resistor logic configuration (e.g., an NMOS transistor or PMOS transistor coupled with a resistor). In additional or alternative aspects, the first inverter and the second inverter include a transistor-transistor logic configuration (e.g., a CMOS configuration). In additional or alternative aspects, the first inverter and the second inverter includes bipolar junction transistors ("BJTs") in either a resistor-transistor logic or a transistor-transistor logic configuration. The first inverter and the second inverter can be manufactured to have equivalent threshold voltages, but actual conditions can result in a difference between the threshold voltages.

In block 630, an output of the first inverter is conductively coupled to an input of the second inverter via a first capacitor. In block 640, an output of the second inverter is conductively coupled to an input of the first inverter with a second capacitor. In some examples, the first capacitor and the second capacitor include equivalent capacitance capable of storing a voltage substantially equal to the difference between the threshold voltages of the first inverter and the second inverter.

In block 650, the input of the first inverter is conductively coupled to the output of the first inverter via a first switch. For example, a switch may be formed, e.g., as a transistor, between the input and output of the first inverter such that when the switch is closed, the input is conductively coupled to the output. In block 660, the input of the second inverter is conductively coupled to the output of the second inverter with a second switch generally as discussed above with respect to block 650.

In some aspects, a process for manufacturing the random number generator further includes providing a means for outputting a digital bit based on a first output voltage of the first inverter and a second output voltage of the second inverter. In one example, the means for outputting the digital bit includes a comparator or an operational amplifier ("op-amp") having a first input terminal, a second input terminal, and an output terminal. The process can include conductively coupling the output terminal of the first inverter to the first input terminal of the comparator. The process can further include conductively coupling the output terminal of the second inverter to the second input terminal of the comparator.

In additional or alternative aspects, the process for manufacturing the random number generator further includes providing a means for verifying a randomness of the digital bit based on digital bits output by the means for outputting the digital bit. In some examples, the means for verifying the randomness of the digital bit includes a processing device with a first input terminal. The processing device can include similar features to the processing device 150 depicted in FIG. 4. The process can further include conductively coupling the output terminal of the means for outputting the digital bit to the input terminal of the processing device. In additional or alternative aspects, the process further includes conductively coupling more than one random bit generators to a means for determining a multibit number from multiple digital bits. In some examples, the means for determining a multibit number from multiple digital bits includes the means for verifying the randomness of the digital bit.

In additional or alternative aspects, the process for manufacturing the random number generator further includes providing a clock source. The process can further include conductively coupling the clock source to the first switch, the second switch, the means for outputting the digital bit, and the means for verifying the randomness of the digital bit. In some examples, the clock source includes a quartz piezo-electric oscillator, tank circuit, or RC circuit for generating a clock signal.

It should be appreciated that the blocks of the method of FIG. 6 need not be performed in the order described, or that some blocks involve optional features, or that other blocks may be employed in addition to, or instead of, those described above.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

What is claimed is:

1. A circuit comprising:
   a first inverter comprising a first input terminal and a first output terminal, the first inverter having a first inverter threshold voltage;

a second inverter comprising a second input terminal and a second output terminal, the second inverter having a second inverter threshold voltage;

a first capacitor conductively coupled between the first output terminal and the second input terminal;

a second capacitor conductively coupled between the second output terminal and the first input terminal;

a first switch conductively coupled between the first input terminal and the first output terminal; and a second switch conductively coupled between the second input terminal and the second output terminal.

2. The circuit of claim 1, further comprising a comparator having a first comparator terminal and a second comparator terminal, wherein the first output terminal and the second output terminal are conductively coupled to the first comparator terminal and the second comparator terminal, respectively.

3. The circuit of claim 2, further comprising a processing device having an input terminal, wherein an output terminal of the comparator is conductively coupled to the input terminal of the processing device, the processing device for verifying a randomness of a digital bit output by the comparator at the output terminal.

4. The circuit of claim 3, wherein at least the first inverter, the second inverter, the first capacitor, the second capacitor, the first switch, the second switch, and the comparator form a random bit generator, the circuit further comprising a plurality of the random bit generators, each of the random bit generators conductively coupled to the processing device, wherein the processing device is for determining a multibit random number based on each digital bit outputted by the random bit generators.

5. The circuit of claim 1, wherein the first switch and the second switch each comprises a switch input terminal coupled to a clock source, each switch switchable based on a common clock signal received at the switch input terminal from the clock source.

6. A method comprising:

substantially simultaneously closing a first switch and a second switch, the first switch conductively coupled between a first input terminal of a first inverter and a first output terminal of the first inverter, the second switch conductively coupled between a second input terminal of a second inverter and a second output terminal of the second inverter, a first output terminal of the first inverter being conductively coupled to the second input terminal of the second inverter by a first capacitor, and the second output terminal of the second inverter being conductively coupled to the first input terminal of the first inverter by a second capacitor;

storing a first voltage on the first capacitor, the first voltage substantially equal to a difference between a first inverter threshold voltage of the first inverter and a second inverter threshold voltage of the second inverter;

storing a second voltage on the second capacitor, the second voltage substantially equal to a difference between the second inverter threshold voltage of the second inverter and the first inverter threshold voltage of the first inverter;

substantially simultaneously opening the first switch and the second switch; and delaying a measurement of an output of the first inverter and an output of the second inverter until the first inverter settles to a first output voltage and the second inverter settles to a second output voltage.

7. The method of claim 6, further comprising outputting, by a comparator, a comparator voltage based on the first output voltage and the second output voltage.

8. The method of claim 7, further comprising verifying, by a processing device, a randomness of the comparator voltage based on a plurality of comparator voltages previously outputted by the comparator.

9. The method of claim 6, further comprises receiving a clock signal having a clock cycle having a first portion and a second portion, the first switch and the second switch closing based on the first portion and opening based on the second portion.

10. The method of claim 9, wherein the first portion of the clock cycle is a rising edge of the clock cycle and the second portion of the clock cycle is a falling edge of the clock cycle.

11. The method of claim 9, wherein the first portion of the clock cycle is a first clock level and the second portion of the clock cycle is a second clock level.

12. A system comprising:

a means for generating two randomly-selected output voltages comprising:

a first inverter comprising a first input terminal and a first output terminal, the first inverter having a first inverter threshold voltage;

a second inverter comprising a second input terminal and a second output terminal, the second inverter having a second inverter threshold voltage;

a first capacitor conductively coupled between the first output terminal and the second input terminal;

a second capacitor conductively coupled between the second output terminal and the first input terminal;

a first switch conductively coupled between the first input terminal and the first output terminal; and a second switch conductively coupled between the second input terminal and the second output terminal; and a means for outputting a digital bit based on the randomly-selected output voltages comprising:

a first output voltage terminal conductively coupled to the first output terminal;

a second output voltage terminal conductively coupled to the second output terminal; and a digital bit output terminal.

13. The system of claim 12, further comprising a means for verifying a randomness of the digital bit, the means for verifying the randomness of the digital bit comprising:

a processing device conductively coupled to the digital bit output terminal; and a memory device that includes data associated with digital bits previously output by the means for outputting the digital bit.

14. The system of claim 13, further comprising a means for transmitting a clock signal having a clock cycle having a first portion and a second portion, the means for transmitting the clock signal communicatively coupled to the means for generating two randomly-selected output voltages, the means for outputting the digital bit, and the means for verifying the randomness of the digital bit.

15. The system of claim 12, wherein the means for generating two randomly-selected output voltages and the means for outputting the digital bit form a random bit generator, the system further comprising:

a plurality of the random bit generators; and a means for determining a multibit number based on digital bits output by the plurality of the random bit generators.

16. A method comprising:
providing a first inverter comprising a first input terminal and a first output terminal, the first inverter having a first inverter threshold voltage;
providing a second inverter comprising a second input terminal and a second output terminal, the second inverter having a second inverter threshold voltage;
conductively coupling the first output terminal and the second input terminal with a first capacitor;
conductively coupling the second output terminal and the first input terminal with a second capacitor;
conductively coupling the first input terminal and the first output terminal with a first switch; and
conductively coupling the second input terminal and the second output terminal with a second switch.

17. The method of claim 16, further comprising:
providing a comparator device having first and second comparator input terminals and a comparator output terminal;
conductively coupling the first output terminal to the first comparator input terminal; and
conductively coupling the second output terminal to the second comparator input terminal.

18. The method of claim 17, further comprising:
providing a means for verifying a randomness of a digital bit; and
conductively coupling the comparator output terminal to an input terminal of the means for verifying the randomness of the digital bit.

19. The method of claim 18, further comprising:
providing a clock source; and
conductively coupling the clock source to the first switch, the second switch, the comparator device, and the means for verifying the randomness of the digital bit.

20. The method of claim 17, wherein the first inverter, the second inverter, the first capacitor, the second capacitor, the first switch, the second switch, and the comparator device form a random bit generator, the method further comprising:
providing a plurality of the random bit generators;
providing a means for determining a multibit number based on a plurality of digital bits; and
conductively coupling each random bit generator of the plurality of random bit generators to an input terminal of the means for determining the multibit number.

* * * * *